(12) United States Patent
Choi et al.

(10) Patent No.: US 12,225,722 B2
(45) Date of Patent: Feb. 11, 2025

(54) NON-VOLATILE MEMORY DEVICE INCLUDING SELECTION GATE AND MANUFACTURING METHOD THEREOF

(71) Applicant: SK keyfoundry Inc., Cheongju-si (KR)

(72) Inventors: Jin Shik Choi, Chilgok-gun (KR); Su Jin Kim, Cheongju-si (KR); Won Kyu Lim, Cheongju-si (KR)

(73) Assignee: SK keyfoundry Inc., Cheongju-si (KR)

( * ) Notice: Subject to any disclaimer, the term of this patent is extended or adjusted under 35 U.S.C. 154(b) by 581 days.

(21) Appl. No.: 17/560,627

(22) Filed: Dec. 23, 2021

(65) Prior Publication Data

US 2022/0406802 A1 Dec. 22, 2022

(30) Foreign Application Priority Data

Jun. 22, 2021 (KR) .......................... 10-2021-0080562

(51) Int. Cl.
*H10B 41/41* (2023.01)
*H10B 41/10* (2023.01)
*H10B 41/50* (2023.01)
*H01L 25/065* (2023.01)

(52) U.S. Cl.
CPC ............. *H10B 41/41* (2023.02); *H10B 41/10* (2023.02); *H10B 41/50* (2023.02); *H01L 25/0655* (2013.01)

(58) Field of Classification Search
CPC ........ H10B 41/41; H10B 41/10; H10B 41/50; H10B 41/30; H10B 41/35; H01L 25/0655; H01L 29/42328; H01L 29/40114; H01L 29/42324; H01L 29/66825
See application file for complete search history.

(56) References Cited

U.S. PATENT DOCUMENTS

| 6,894,339 B2 * | 5/2005 | Fan .................... H01L 29/66825 257/314 |
| 8,664,708 B2 | 3/2014 | Jung et al. |
| 9,330,921 B2 | 5/2016 | Kim et al. |
| 9,842,845 B1 * | 12/2017 | Melde .................... H10B 41/30 |

(Continued)

FOREIGN PATENT DOCUMENTS

| CN | 105448930 A * | 3/2016 | ....... H01L 21/26513 |
| KR | 10-0317318 B1 | 12/2001 | |

(Continued)

OTHER PUBLICATIONS

Korean Office Action issued on Jun. 21, 2022 in corresponding Korean Patent Application No. 10-2021-0080562 (6 page in Korean).

(Continued)

*Primary Examiner* — Sitaramarao S Yechuri
(74) *Attorney, Agent, or Firm* — NSIP Law

(57) ABSTRACT

A non-volatile memory device, includes a source region and a drain region disposed in a channel length direction on a substrate; a flash cell, including a floating gate and a control gate, disposed between the source region and the drain region; a selection gate disposed between the source region and the flash cell; a selection line connecting the selection gate; a word line connecting the control gate; a common source line connected to the source region; and a bit line connected to the drain region.

20 Claims, 19 Drawing Sheets

(56) References Cited

U.S. PATENT DOCUMENTS

| | | |
|---|---|---|
| 10,332,964 B2 | 6/2019 | Lee et al. |
| 10,658,364 B2 | 5/2020 | De Santis et al. |
| 2002/0047138 A1* | 4/2002 | Watanabe .............. H10B 69/00 |
| | | 257/230 |
| 2006/0273378 A1* | 12/2006 | Gao .................. H01L 29/42336 |
| | | 257/326 |
| 2011/0221006 A1* | 9/2011 | Chen ...................... H10B 41/30 |
| | | 257/E27.06 |
| 2015/0311299 A1* | 10/2015 | Cho .................. H01L 29/40114 |
| | | 257/319 |

FOREIGN PATENT DOCUMENTS

| | | |
|---|---|---|
| KR | 10-2004-0021772 A | 3/2004 |
| KR | 10-2005-0005057 A | 1/2005 |

OTHER PUBLICATIONS

Korean Office Action issued on Dec. 28, 2022, in counterpart Korean Patent Application No. 10-2021-0080562 (7 pages in Korean).

* cited by examiner

NON-VOLATILE MEMORY DEVICE INCLUDING SELECTION GATE AND MANUFACTURING METHOD THEREOF

CROSS-REFERENCE TO RELATED APPLICATION

This application claims the benefit under 35 U.S.C. § 119 to Korean Patent Application No. 10-2021-0080562 filed on Jun. 22, 2021, in the Korean Intellectual Property Office, the entire disclosure of which is incorporated herein by reference for all purposes.

BACKGROUND

1. Field

The following disclosure relates to a non-volatile memory device including a selection gate and manufacturing method thereof.

2. Description of Related Art

A traditional non-volatile memory device, e.g., an EEPROM, has a structure where a floating gate is in the middle, and a control gate is placed on opposite sides of the floating gate. According to the traditional method, the control gate of a memory device is produced by etch-backing a poly layer as a form of a spacer.

As memory device cells produced by the traditional method is used in various products, there is a desire to reduce leakage current, especially in high temperature operations.

Leakage current in a memory device cell may be reduced by increasing the length of the control gate, but it may result in an undesirable increase in the area of a unit cell.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

In one general aspect, a non-volatile memory device, includes a source region and a drain region disposed in a channel length direction on a substrate; a flash cell, including a floating gate and a control gate, disposed between the source region and the drain region; a selection gate disposed between the source region and the flash cell; a selection line connecting the selection gate; a word line connecting the control gate; a common source line connected to the source region; and a bit line connected to the drain region.

A length of the selection gate may be longer than a length of the floating gate, based on a direction orthogonal to the channel length direction, and the length of the floating gate may be shorter than a length of the control gate, based on the direction orthogonal to the channel length direction.

The non-volatile memory device may further include a control gate pick up structure, connected to the control gate, including a plurality of floating gate poly-silicon patterns; and a control gate contact plug may be disposed between the plurality of floating gate poly-silicon patterns.

The non-volatile memory device may further include an extended selection gate connected to the selection gate, and a selection gate contact plug disposed in the extended selection gate.

A spacer of the control gate and a spacer of the selection gate may be spaced apart or in contact with each other.

The selection gate may be disposed lower than the floating gate or the control gate, relative to a surface of the substrate.

The selection line and the word line may be in parallel with each other, the common source line and the bit line may be in parallel with each other, and the selection line and the word line may be orthogonal to the common source line and the bit line, respectively.

The non-volatile memory device may further include a low concentration doping region disposed between the flash cell and the selection gate.

Floating gates may be disposed in the control gate from a top view of the non-volatile memory device.

A horizontal width of the extended selection gate may be wider than a horizontal width of the selection gate.

In another general aspect, a non-volatile memory device, includes a source region and a drain region disposed in a channel length direction on a substrate, a flash cell, including a floating gate and a control gate, disposed between the source region and the drain region, a selection gate disposed between the source region and the flash cell, an extended selection gate connected to the selection gate, and a control gate pick up structure connected to the control gate.

The control gate may include a first control gate and a second control gate. The first control gate and the second control gate may be connected to each other and disposed to surround the floating gate. Widths of the first control gate and the second control gate may be identical to each other.

The non-volatile memory device may further include a floating gate insulating film disposed between the substrate and the floating gate, a control gate insulating film disposed between the substrate and the control gate, and a selection gate insulating film disposed between the substrate and the selection gate.

The control gate pick up structure may include floating gate poly-silicon patterns, and a control gate contact plug may be disposed between the floating gate poly-silicon patterns.

The non-volatile memory device may further include a selection gate contact plug disposed in the extended selection gate.

The non-volatile memory device may further include a control gate spacer disposed on a side of the control gate and a selection gate spacer disposed on a side of the selection gate.

The control gate spacer and the selection gate spacer may be spaced apart from each other.

The control gate spacer and the selection gate spacer may be in contact with each other.

The selection gate may be disposed lower than the floating gate or the control gate, relative to a surface of the substrate.

A length of the selection gate may be longer than a length of the floating gate, based on a direction orthogonal to the channel length direction, and the length of the floating gate may be shorter than a length of the control gate, based on the direction orthogonal to the channel length direction.

In another general aspect, a non-volatile memory device includes trenches disposed in a substrate; a first source region and a first drain region disposed between a first trench of the trenches and a second trench of the trenches; a second source region and a second drain region disposed between the second trench and a third trench of the trenches; a flash cell including a floating gate, and a first control gate and a second control gate disposed on opposing sides of the floating gate, respectively, wherein the flash cell is disposed between the first source region and the first drain region; a selection gate disposed between the source region and the flash cell; and a logic gate disposed between the second source region and the second drain region.

A well region, disposed below the logic gate, may be between the second trench and the third trench.

A length of the selection gate may be longer than a length of the floating gate, and the length of the floating gate may be shorter than a length of the control gate.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
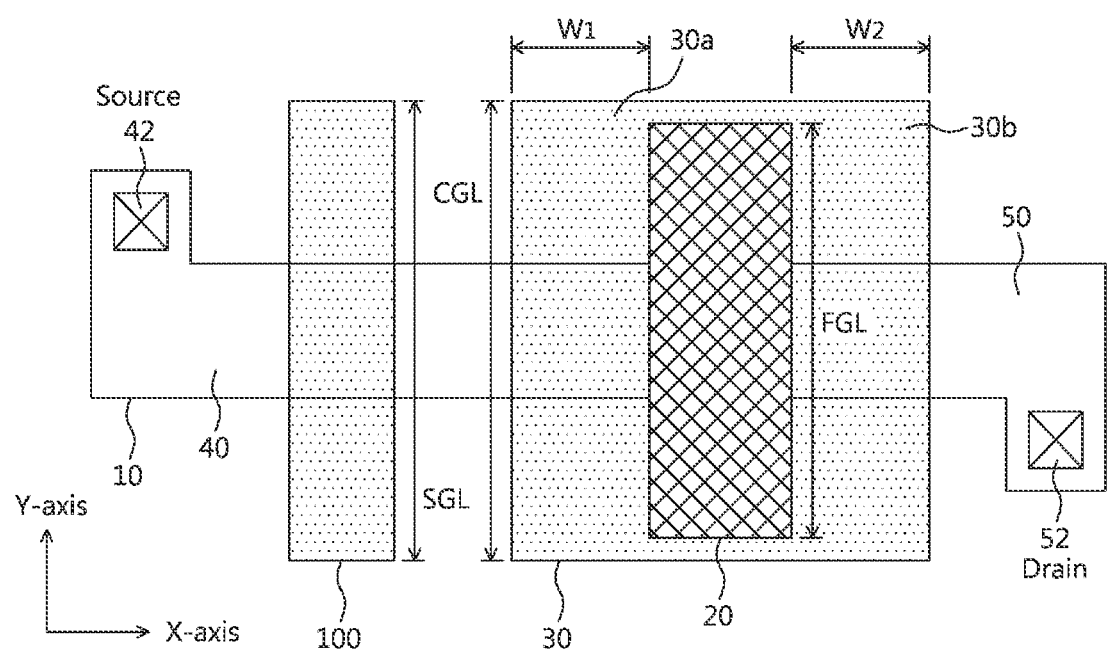
FIG. 1 is a layout of an example of a memory cell in a non-volatile memory device according to the disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," etc. may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The following disclosure relates to a non-volatile memory device to block a leakage current path and prevent an occurrence of a leakage current when a device is in off state by using a selection gate and manufacturing method thereof.

The disclosure is to provide a non-volatile memory device that may efficiently prevent an occurrence of a leakage current in a high temperature operation by blocking a path of a leakage current when a memory cell is in an off state.

The detailed description is given below, based on embodiments shown in drawings.

Figure 2:
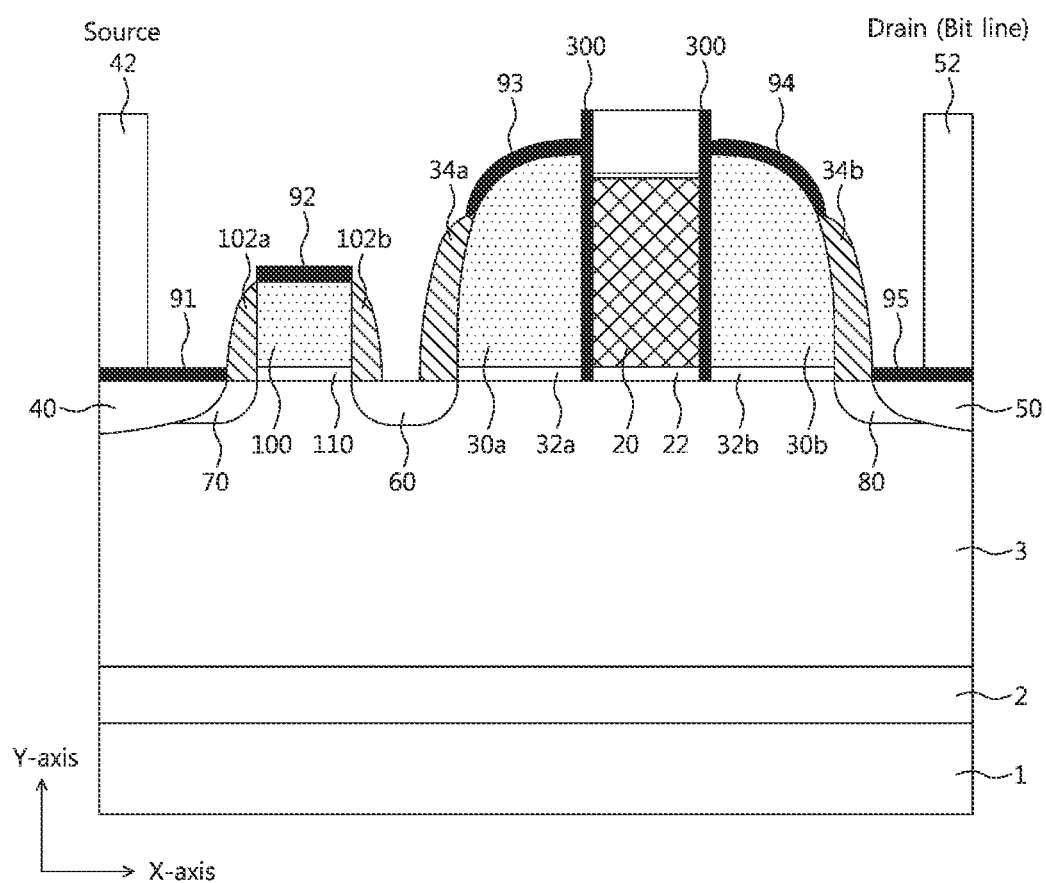
FIG. 2 shows a cross-sectional structure of an example of a memory cell according to the disclosure.

FIG. 1 is a layout of an example of a memory cell in a non-volatile memory device according to the disclosure, and FIG. 2 shows a cross-sectional structure of an example of a memory cell according to the disclosure.

As illustrated in FIG. 1, a floating gate 20 is formed in an active area 10, and a control gate 30 surrounding a floating gate 20 is formed. The combination of the floating gate 20 and the control gate 30 may be called a flash cell. A control gate 30 may be divided into a first control gate 30a and a second control gate 30b, and they are connected to each other. A first control gate 30a and a second control gate 30b may have a first width W1 and a second width W2, respectively, in a channel direction. The first width W1 and the second width W2 are identical to each other. In this embodiment, the floating gate 20 is centrally placed, and the first control gate 30a and the second control gate 30b are symmetrical about the floating gate 20.

A selection gate 100 may be formed between the first control gate 30a and a source region 40. In one or more embodiments of the disclosure, plural selection gates, e.g., more than one selection gate 100, are added to a traditional memory device. The selection gate 100 may prevent an occurrence of a leakage current in a high temperature operation. Based on a direction (y-axis, vertical axis) orthogonal to a channel length direction (x-axis, horizontal axis), the length (SGL) of a selection gate 100 is identical to the length (CGL) of the control gate 30. The reason why it may be beneficial to form the length (SGL) of the selection gate 100 and the length (CGL) of the control gate 30 to be identical is that a desired length may be obtained when patterning a selection gate and a control gate. Since the selection gate 100 is located near the control gate 30, the selection gate may function like a dummy gate when etching the control gate.

Based on the direction (y-axis, vertical axis) orthogonal to the channel length direction (x-axis, horizontal axis) as depicted in the figures, the length (SGL) of the selection gate 100 may be formed longer than the length (FGL) of the floating gate 20 because the floating gate 20 is formed inside the control gate 30. Based on the direction (y-axis, vertical axis) orthogonal to the channel length direction (x-axis, horizontal axis), the length (FGL) of the floating gate 20 may be shorter than the length (CGL) of the control gate 30.

The height of the selection gate 100 (vertical direction from a substrate, see FIG. 2) may be formed lower than the control gate 30 and the floating gate 20, relative to a surface of the substrate.

In FIG. 1 and FIG. 2, a source region 40 and a drain region 50 are placed in an active area 10. Positions of the source region 40 and the drain region 50 may be interchangeable. Contact plugs 42, 52 may be located in an active area 10 to give voltage to the source region 40 and the drain region 50. Due to the wiring connecting to the contact plugs 42, 52, corresponding contact plug of the contact plugs 42, 52 to source region 40 and the drain region 50 may not be in alignment to each other. To provide different voltages, independent wirings may be used, which may result in the contact plug 42 formed on the source region 40 and the contact plug 52 formed on the drain region 50 not being in alignment with each other.

As illustrated in FIG. 2, a memory device may include a first well region 2 of a second conductivity type and a second well region 3 of a first conductivity type in a substrate 1 of a first conductivity type. When the substrate 1 is of a P-type, a first well region 2 is of an N-type, and a second well region 3 is of a P-type. A first well region 2 is a region to electrically isolate the substrate 1 from the second well region 3.

A memory device may include a floating gate insulating film 22 and a floating gate 20 in a substrate 1. The floating gate 20 may refer to an electrode in an electrical floating state because there is no electrically connected contact plug. A dielectric layer 300 may be formed on a side of the floating gate 20.

A memory device may include a first control gate 30a and a second control gate 30b formed on a side of a floating gate 20. The width W1, W2 of the first control gate 30a and the second control gate 30b are identically designed, but certainly, they may be designed differently. First and second control gate insulating films 32a, 32b may be formed between the first control gate 30a and the second control gate 30b, and the substrate 1. Control gate spacers 34a, 34b may be formed on sides of the first and second control gates 30a, 30b, respectively. Such first and second control gates 30a, 30b may completely surround the contour of the floating gate 20.

A memory device may include a selection gate 100 spaced apart from a first control gate 30a by a predetermined distance. The selection gate 100 may be located between a source region 40 and a first control gate 30a. A selection gate insulating film 110 may be formed between a selection gate 100 and a substrate 1, and selection gate spacers 102a, 102b may be formed on sides of it. The selection gate 100 may play a role to block a current path between the source region 40 and the control gate 30. The role may be to prevent an occurrence of leakage current in the substrate 1 when the memory device is in an off state.

As shown in FIG. 2, a first doping region 60 is formed between a selection gate 100 and a first control gate 30a in a substrate 1. Second doping regions 70, 80 may be formed between a source region 40 and the selection gate 100, and a second control gate 30b and a drain region 50, respectively. The first and second doping regions 60, 70, 80 may be LDD regions having low concentrations. The first doping region 60 may be used as drain region of a selection gate 100 and a source region of a control gate 30a.

And, in the selection gate 100 and the control gate 30, silicides 92, 93, 94 may be formed on surfaces where there is no spacer. Silicides 91, 95 may be formed on substrate surfaces to lower contact resistance.

A source region 40 and a drain region 50 are formed in the substrate 1. The source region 40 may be formed adjacent to a selection gate 100, and a contact plug 42 for a source line may be formed in a source region 40. The drain region 50 may be formed adjacent to a second control gate 30b, and a contact plug 52 for a bit line may be formed in the drain region 50. Metal wirings are connected to the contact plugs 42, 52.

Figure 3:
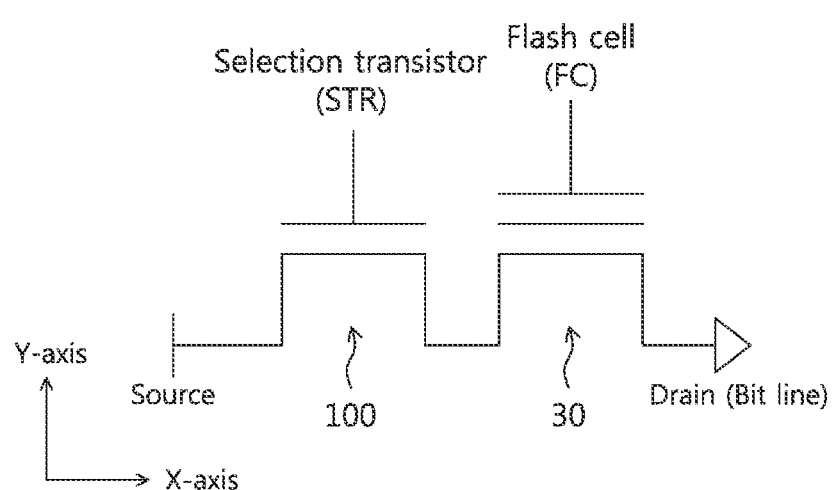
FIG. 3 is a circuit block diagram of an example of a unit cell of a non-volatile memory device of the disclosure.

FIG. 3 is an example of a circuit block diagram of a unit cell of a non-volatile memory device of the disclosure. As illustrated, a selection transistor (STR) including a selection gate 100 may be included on a current path of a source and a drain. The selection transistor (STR) may be formed near a source region. And, a flash cell (FC) including a floating gate and a control gate 30 may be placed on a source and drain current path. The STR and the FC may be sequentially disposed. A selected cell may be normally operated in an erase or program operation, and unselected cells may remain in an off state. As a result, a leakage current should not occur in an off state, and by ensuring an off state using the selection gate, leakage current may not occur in unselected cells. That is, when additionally incorporating the selection gate 100 on a current path, the path of a leakage current may be blocked by the switching operation of the selection gate 100.

The following Table 1 relates to a circuit operation voltage of the disclosure. Herein, CG and SG refer to a control gate and a selection gate, respectively.

TABLE 1

| Operation | CG | Drain | Vsub | Source | SG |
|---|---|---|---|---|---|
| Erase | 0 V | 14 V | 14 V | Floating | 0 V |
| Program | 16 V | 0 V | 0 V | Floating | 0 V |
| Read | 2.5 V | 1.0 V | 0 V | 0 V | 3.3 V |

Figure 4:
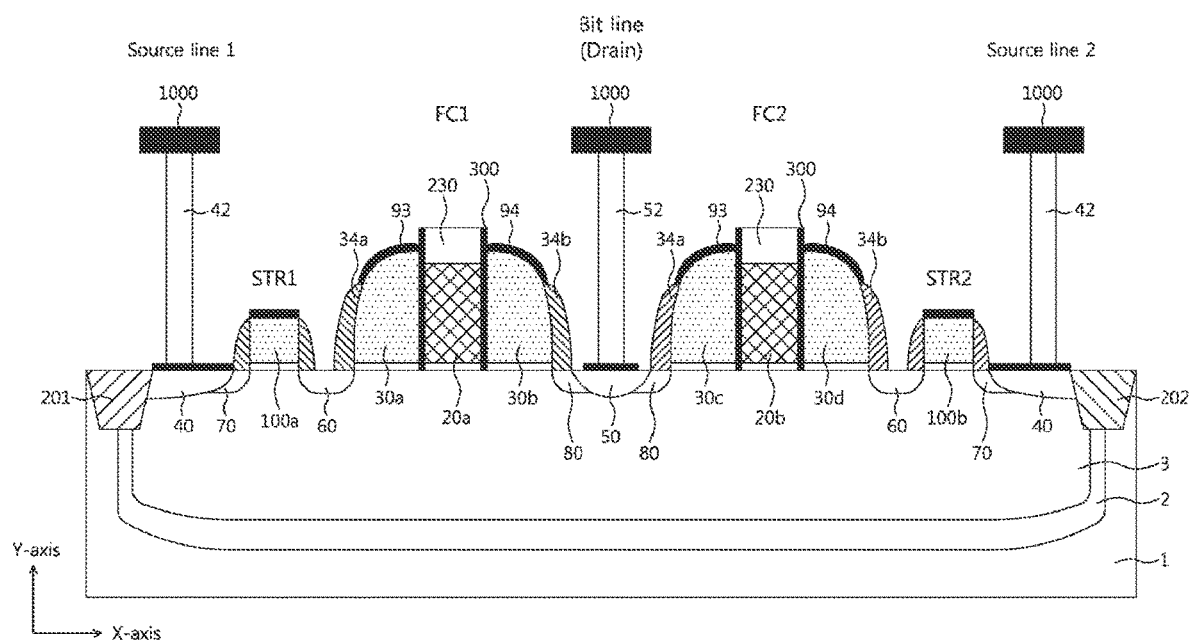
FIG. 4 is a cross-sectional view of an example of a memory cell array of a non-volatile memory device including two-unit cells, according to an embodiment of the disclosure.

FIG. 4 is a cross-sectional view of an example of a memory cell array of a non-volatile memory device including two-unit cells, according to an embodiment of the disclosure.

With reference to FIG. 4, two-unit cells are shown. A first selection transistor STR1, a first flash cell FC1, a second flash cell FC2, and a second selection transistor STR2 are sequentially placed between a first trench 201 and a second trench 202. Each selection transistor (STR) may include a selection gate 100a, 100b. Each flash cell (FC) may include a floating gate 20a, 20b and a control gate 30a, 30b, 30c, 30d.

A first source region (40, left) and a drain region 50 are formed on a substrate, and a first selection transistor STR1 and a first flash cell FC1 are in a first source region 40 and a drain region 50. A second selection transistor STR2 and a second flash cell FC2 are located between a second source region (40, right) and a drain region 50. A first source region (40, left) and a second source region (40, right) are respectively connected to a source contact plug 42, and a source contact plug 42 is connected to a source line.

Therefore, the drain region 50 is formed between the first flash cell FC1 and the second flash cell FC2. The drain region 50 may become a common drain region 50 that is used by both the first flash cell FC1 and the second flash cell FC2. And, a drain contact plug 52 connected to a drain region 50 is formed. The drain contact plug 52 is connected to a bit line. A selection transistor and a flash cell may be symmetrically placed on opposite sides centering on the drain region 50.

A first well region 2 (DNW) of a second conductivity type and a second well region 3 (PW) of a first conductivity type may be included in a substrate 1 (P-sub) of a first conductivity type. A first well region 2 (DNW) is a region to electrically isolate a substrate 1 and a second well region 3 (PW). Low concentration doping regions 60, 70, 80 may be formed in the substrate 1 inside a well region 3. Spacers 34a, 34b may be formed on sides of selection gates 100a, 100b, and first and second control gates 30a to 30d. Silicide films 93, 94 may be formed on first and second control gates 30a to 30d. A plurality of metal wirings 1000 may be respectively connected to a plurality of contact plugs 42, 52, 62.

Figure 5:
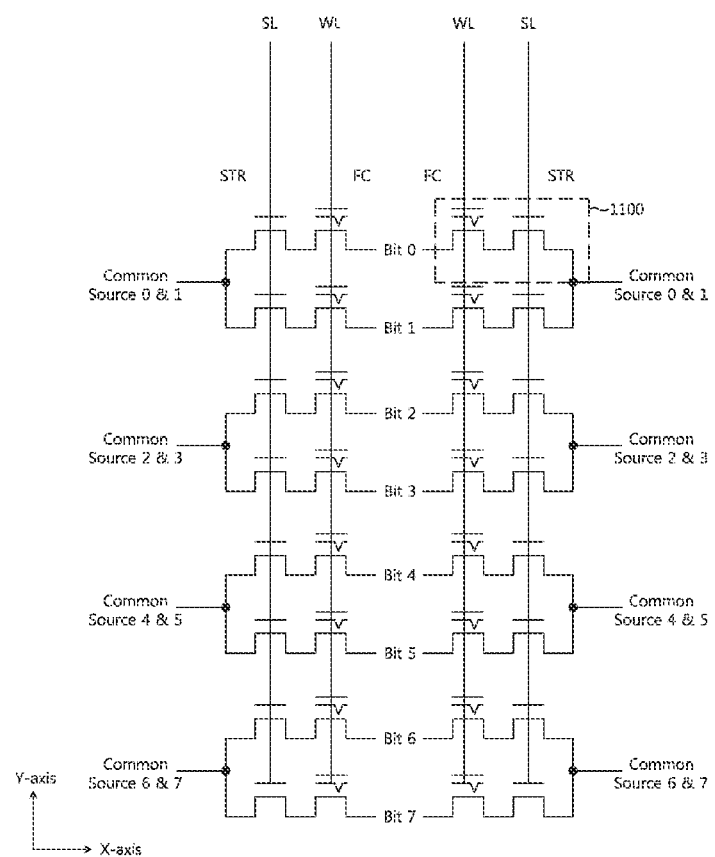
FIG. 5 is a circuit diagram of an example of a memory cell array of a non-volatile memory device according to an embodiment of the disclosure.

FIG. 5 is a circuit diagram of an example of a memory cell array of a non-volatile memory device according to an embodiment of the disclosure.

With reference to FIG. 5, a cell array according to an embodiment of the disclosure includes a plurality of non-volatile memory unit cells 1100. A cell array according to an embodiment of the disclosure includes a plurality of word lines (WL) formed in a row direction (x-axis direction) and a plurality of bit lines (Bit0 to Bit7) formed in a column direction (y-axis direction) to be orthogonal to a world line (WL).

As shown in FIG. 5, a plurality of non-volatile memory unit cells 1100 that is placed in a point where a word line (WL) is orthogonal to bit lines (Bit) may be included. A non-volatile memory unit cell 1100 may include a selection transistor (in short, STR) and a flash cell (in short, FC).

A cell array according to an embodiment of the disclosure may include a selection line (SL) connecting selection gates of selection transistors with other, a word line (WL) connecting control gates of flash cells (FC), a bit line (BL or Bit0, Bit1, Bit2, Bit3, Bit4, Bit5, Bit6, Bit7) connected to a drain region of a flash cell, and a common source line (Common Source 0, Common Source 1, Common Source 2, Common Source 3, Common Source 4, Common Source 5, Common Source 6, Common Source 7) connected to a source region of a flash cell. A selection line (SL) and a bit line (BL) may be selected for an operation of a program and an erase of a unit cell 1100, and a necessary voltage is applied.

Figure 6:
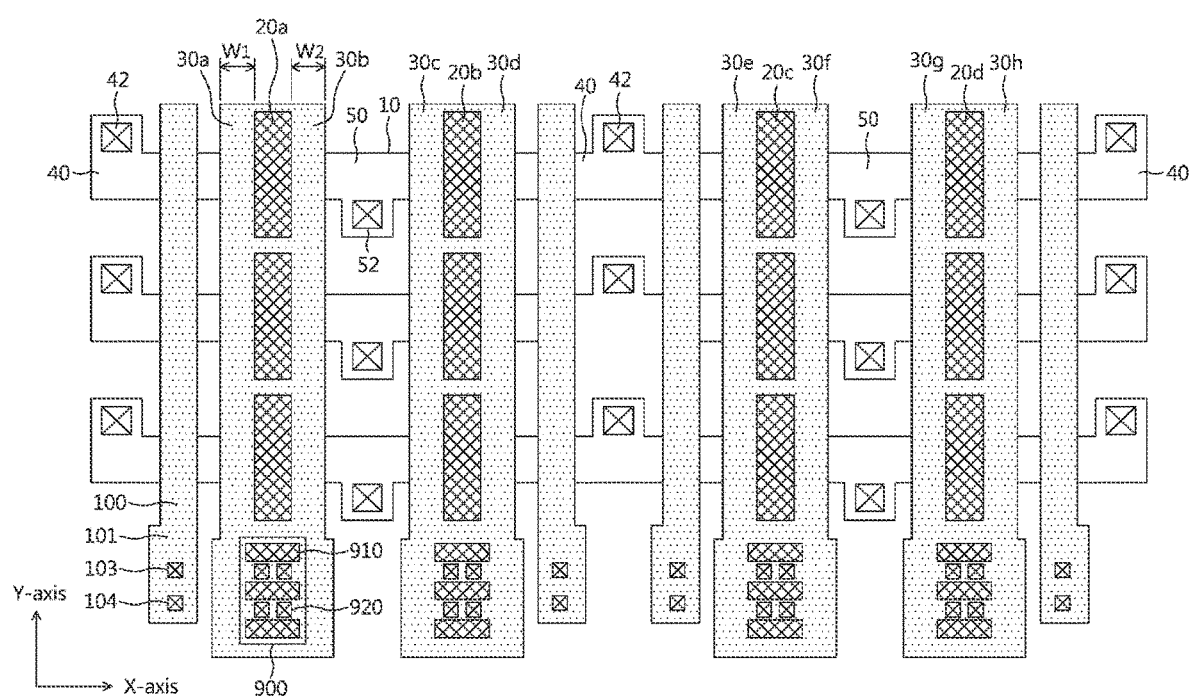
FIG. 6 is a cross-sectional view of an example of a non-volatile memory device including multiple cells, according to an embodiment of the disclosure.

FIG. 6 is a cross-sectional view of an example of a non-volatile memory device having multiple cells, according to an embodiment of the disclosure.

In FIG. 6, floating gates 20a, 20b, 20c, 20d may be in an active area 10, and pairs of control gates 30a-30h may surround corresponding ones of the floating gates 20a, 20b, 20c, 20d. A plurality of floating gates 20a may be disposed vertically, i.e., in a top/bottom, inside each of the control gates 30a-30h.

A source region 40 and a drain region 50 are placed in an active area 10 in a channel length direction (X-axis). A source and drain contact plug 42, 52 may be located in an active area 10 to provide a voltage to source region 40 and a drain region 50, respectively. A source contact plug 42 connected to a source region 40 may be connected to one of common source lines (Common Source0, Common Source1, Common Source2, Common Source3). Also, a drain contact plug 52 connected to a drain region 50 may be connected to a bit line (BL).

As shown in FIG. 6, a control gate 30 includes a first control gate 30a and a second control gate 30b both connected to each other. The first control gate 30a has a first width W1 in a channel direction. The second control gate 30b has a second width W2 in a channel direction. A control gate pick up structure 900 is connected to a control gate 30.

A control gate pick up structure 900 may be formed to have, at least, two or more floating gate poly-silicon patterns (FG Poly-Si pattern) 910. At least one control gate contact plug 920 is formed between floating gate poly-silicon patterns (FG Poly-Si pattern) 910. Two control gate contact plugs 920 are formed in each space between floating gate poly-silicon patterns (FG Poly-Si pattern) 910 in FIG. 5, but a scope of a right of the disclosure is not limited by this number. Since a control gate contact plug 920 and a floating gate poly-silicon pattern (FG Poly-Si pattern) 910 cannot be in contact with each other, it may be desirable to form an enough space between at least two floating gate poly-silicon patterns (FG Poly-Si pattern) 910.

Herein, a floating gate poly-silicon pattern (FG Poly-Si pattern) 910 may be considered as a dummy floating gate. In a control gate pick up structure 900, a floating gate poly-silicon pattern (FG Poly-Si pattern) 910 may help a top surface of the control gate 30 to be flatly formed. Therefore, a control gate contact plug 920 may be formed on a top surface of a flat control gate 30. For example, each of control gates 30*a*, 30*b* shown in FIG. 2 or FIG. 4 has a curve-shaped slope for a top surface, which may make it undesirable to form a control gate contact plug 920 on the top surface. Thus, a control gate pick up structure 900 is formed.

According to FIG. 6, a selection gate 100 may exist between a source region 40 and a control gate 30. A selection gate 100 may be connected to a selection line (SL), and an extended selection gate 101 connected to a selection gate 100 may be formed. A selection gate contact plug 103, 104 may be formed in an extended selection gate 101. A horizontal width of an extended selection gate 101 may be formed wider than a width of a selection gate 100 because a selection gate contact plug 103, 104 may be formed in an extended selection gate 101.

According to FIG. 6, based on a direction (y-axis) orthogonal to a channel length direction (x-axis), a length of a selection gate 100 may be formed longer than lengths of the floating gates 20*a*, 20*b*, 20*c*, 20*d*. In a non-limiting example, the length of the selection gate 100 may be formed to be about 3 times longer than lengths of the floating gates 20*a*, 20*b*, 20*c*, 20*d*. Also, based on a direction orthogonal to a channel length direction, the lengths of the floating gates 20*a*, 20*b*, 20*c*, 20*d* may be shorter than lengths of the control gates 30*a*~30*h*.

Figure 7:
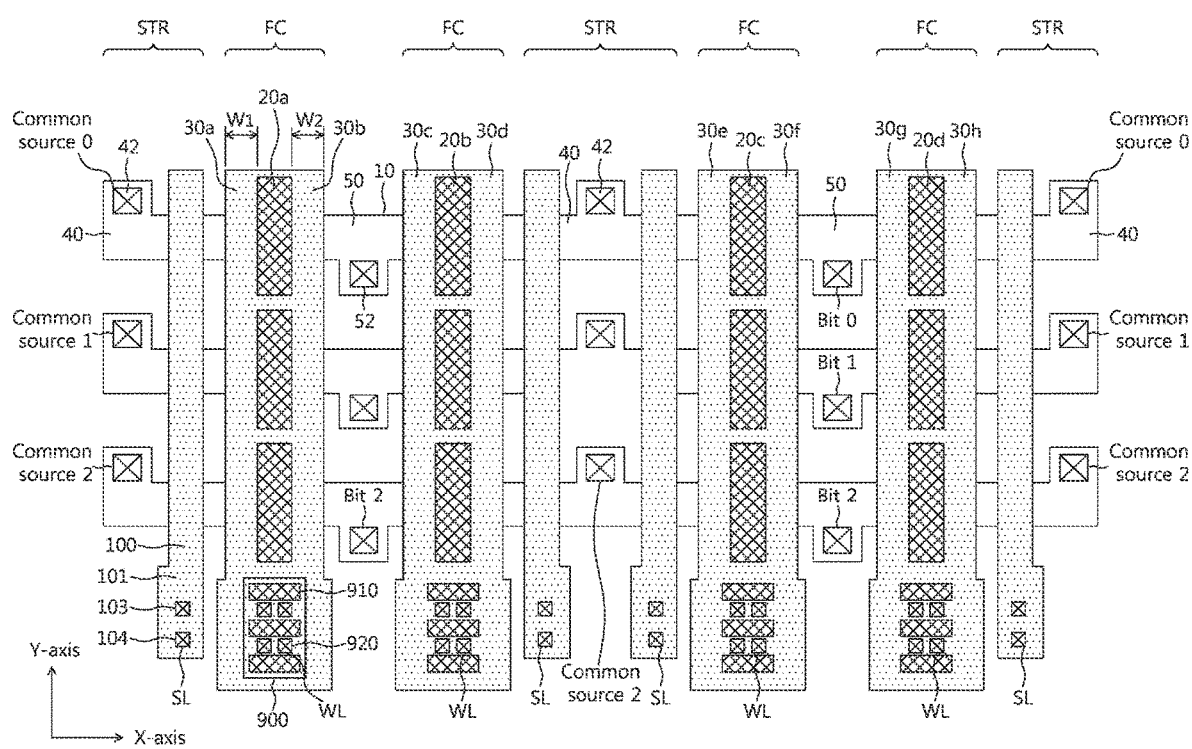
FIG. 7 is a cross-sectional view of an example of a non-volatile memory device including multiple cells, according to an embodiment of the disclosure.

FIG. 7 is a cross-sectional view of an example of a non-volatile memory device including multiple cells, according to an embodiment of the disclosure.

With reference to FIG. 7, as mentioned above, a combination of a floating gate 20 and a control gate 30 may be called a flash cell (FC). A control gate 30 includes a first control gate 30*a* and a second control gate 30*b*. A first control gate 30*a* and a second control gate 30*b* are connected to each other. And, a selection transistor (STR) is placed right near a flash cell (FC). A source contact plug 42 connected to a source region 40 may be connected to one of common source lines (Common Source 0, Common Source 1, Common Source 2). Also, a drain contact plug 52 connected to a drain region 50 may be connected to one of bit lines (Bit0, Bit1, Bit2). A control gate contact plug 920 may be connected to one of a plurality of word lines (WL). A selection gate contact plug 103, 104 may be connected to one of selection lines (SL).

Figure 8:
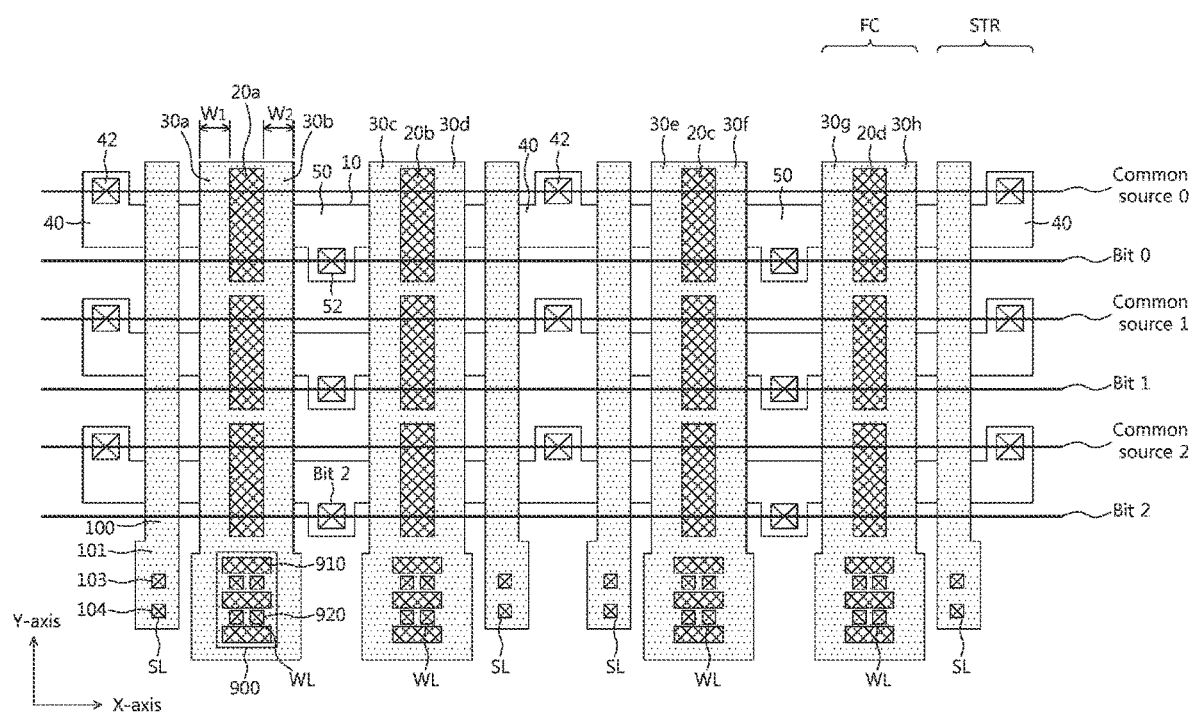
FIG. 8 shows an example of a common source line and a bit line according to an embodiment of the disclosure.

FIG. 8 shows an example of a common source line and a bit line according to an embodiment of the disclosure.

With reference to FIG. 8, a common source line (Common Source 0, Common Source 1, Common Source 2) and a bit line (Bit0, Bit1, Bit2) may be formed by turns. A common source line (Common Source 0, Common Source 1, Common Source 2) and a bit line (Bit0, Bit1, Bit2) run parallel with each other in a same direction with a channel length direction (x-axis). Although it is not shown, a plurality of word lines (WL) and a plurality of selection lines (SL) run parallel with each other in an orthogonal direction (y-axis) to a channel length direction. Therefore, a plurality of word lines (WL) and a plurality of selection lines (SL) may be orthogonal to a common source line (Common Source 0, Common Source 1, Common Source 2) and a bit line (Bit0, Bit1, Bit2).

Figure 9:
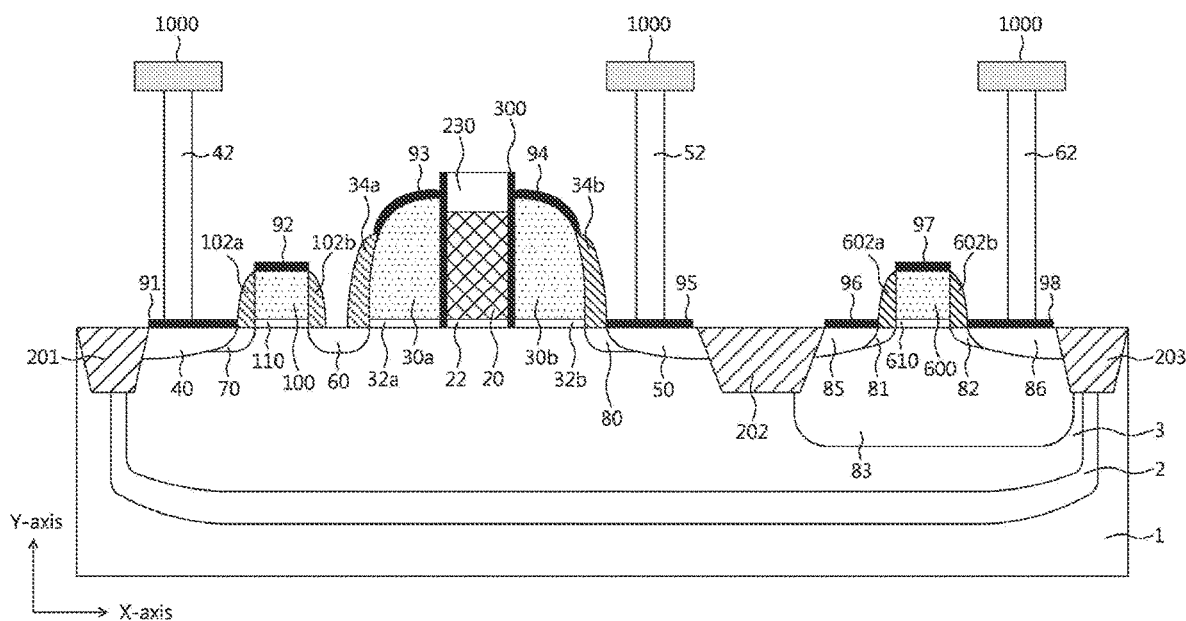
FIG. 9 is a cross-sectional view of an example of a non-volatile memory device according to another embodiment of the disclosure.
Figure 10:
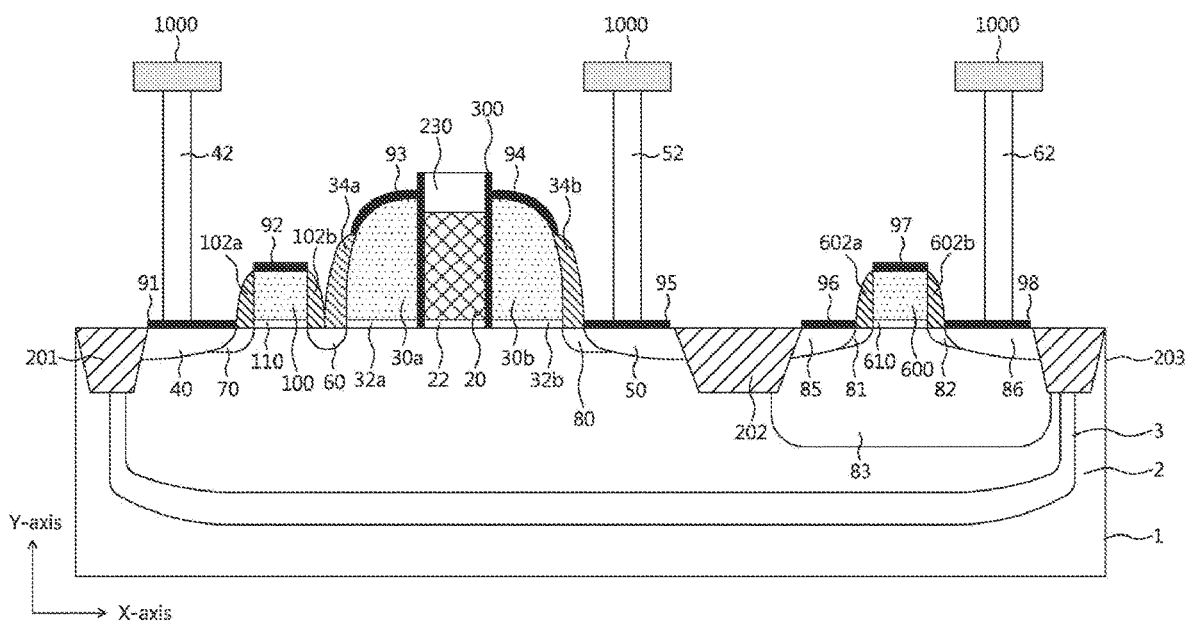
FIG. 10 is a cross-sectional view of an example of a non-volatile memory device according to another embodiment of the disclosure.

FIG. 9 and FIG. 10 are cross-sectional views of examples of a non-volatile memory device according to another embodiment of the disclosure. FIG. 9 and FIG. 10 have a similar structure.

With reference to FIG. 9, a selection gate 100, a first and a second control gate 30*a*, 30*b*, and a floating gate 20 are formed between a first trench 201 and a second trench 202. A logic gate 600 is formed between a second trench 202 and a third trench 203. A well region 83 is additionally formed under a logic gate 600. Low concentration doping regions 40, 50, 60, 81, 82 may be formed in a substrate 1. Low concentration doping regions 81, 82 may be formed inside a well region 83. Spacers 102*a*, 102*b*, 34*a*, 34*b*, 602*a*, 602*b* may be formed in pairs on a side of a selection gate 100, a first and a second control gate 30*a*, 30*b*, and a logic gate 600, respectively. Herein, a spacer 102*b* of a selection gate 100 and a spacer 34*a* of a first control gate 30*a* are spaced from each other. High concentration source/drain regions 70, 80, 85, 86 are formed adjacent respective ones of the low concentration doping regions 40, 50, 60, 81, 82. Silicides 91, 92, 93, 94, 95, 96, 97, 98 are formed on a surface of the low concentration doping region 40, the selection gate 100, the first control gate 30*a*, the second control gate 30*b*, the low concentration doping region 50, the high concentration source/drain region 85, the logic gate 600, the high concentration source/drain region 86, respectively. A plurality of contact plugs 42, 52, 62 connected to a metal wiring 1000 may be formed.

However, with reference to FIG. 10, a spacer 102*b* of a selection gate 100 and a spacer 34*a* of a first control gate 30*a* are in contact with each other. A path of a leakage current may be blocked even in this structure, according to an operation of a selection gate, therefore, an occurrence of a leakage current may be prevented.

FIG. 11 to FIG. 19 show a manufacturing process of a non-volatile memory device of the disclosure.

Figure 11:
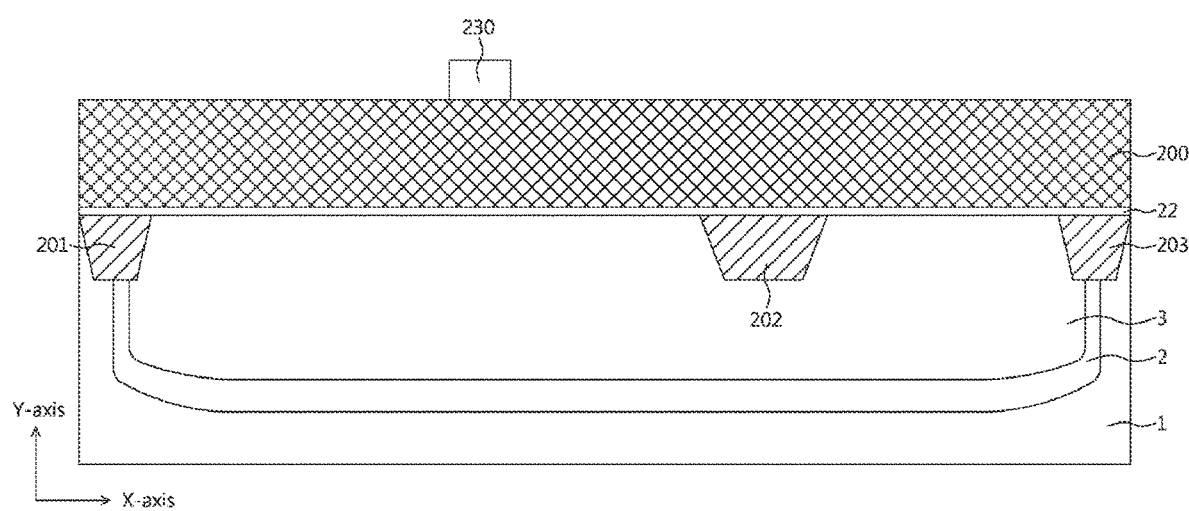
FIG. 11 to FIG. 19 show a manufacturing process of an example of a non-volatile memory device of the disclosure.

With reference to FIG. 11, a first well region 2 and a second well region 3 are formed in a substrate 1. A substrate 1 and a second well region 3 have a same conductivity type, and a first well region 2 is a region doped with a different conductivity type to electrically isolate a substrate 1 and a second well region 3.

Trenches 201, 202, 203 may be formed in a substrate 1 to electrically isolate a unit memory cell from an adjacent cell. Trenches 201, 202, 203 may refer to a shallow trench isolation (STI) filled with an insulating material.

A floating gate insulating film 22 (tunneling oxide layer) and a first poly-silicon 200, which is a type of a conductive layer, may be sequentially deposited on a substrate 1. A deposition thickness of a floating gate insulating film 22 and a first poly-silicon 200 may be different. A first poly-silicon 200 may be formed much thicker, and the thickness may be an element to determine an etch selectivity of a floating gate 20. A first poly-silicon 200 may become a floating gate 20 later.

A hard mask 230 may be formed only in a portion where a floating gate is formed. An oxide layer, a nitride layer, or a combination of an oxide layer and a nitride layer may be used for a hard mask 230. Generally, the thickness of a hard mask 230 may be determined by the thickness of the floating gate 20.

According to an embodiment of the disclosure, a selection gate 100 may be formed further between a source region 40 and a floating gate 20. Therefore, as illustrated in FIG. 11, a length between a first trench 201 and a second trench 202 may be longer than a length between a second trench 202 and a third trench 203. In other words, a length of an active area may be formed longer than that of a traditional case to form a selection gate 100 further. Since a selection gate 100 may be formed further, it may be desirable to form a floating gate 230 to be biased to a second trench 202.

Figure 12:
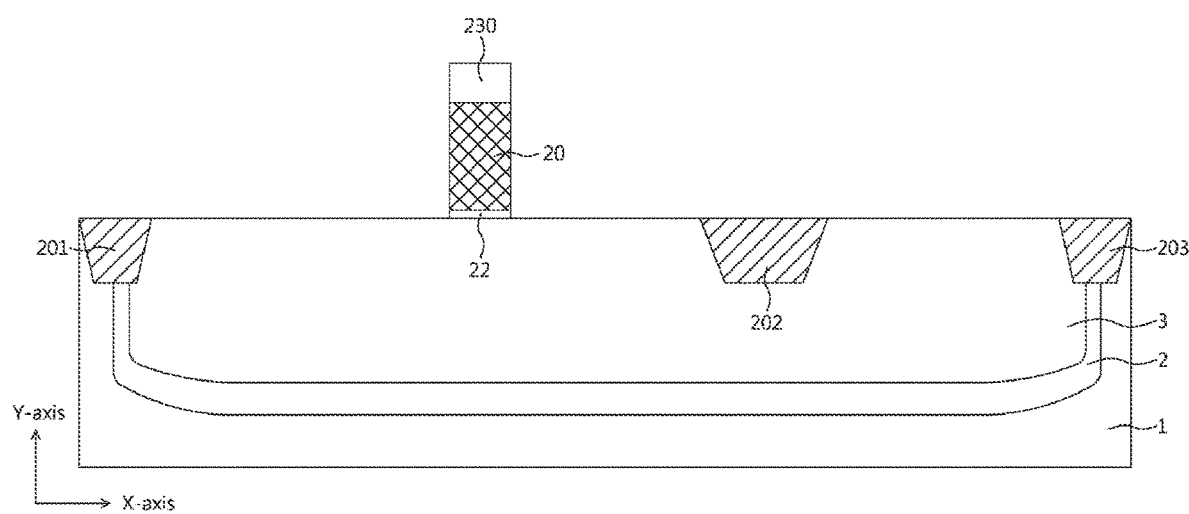

According to FIG. 12, a floating gate 20 may be formed by etching a first poly-silicon 200 using a hard mask 230. A hard mask 230 may be an oxide layer or a nitride layer, or stacking an oxide layer and a nitride layer may be usable.

Figure 13:
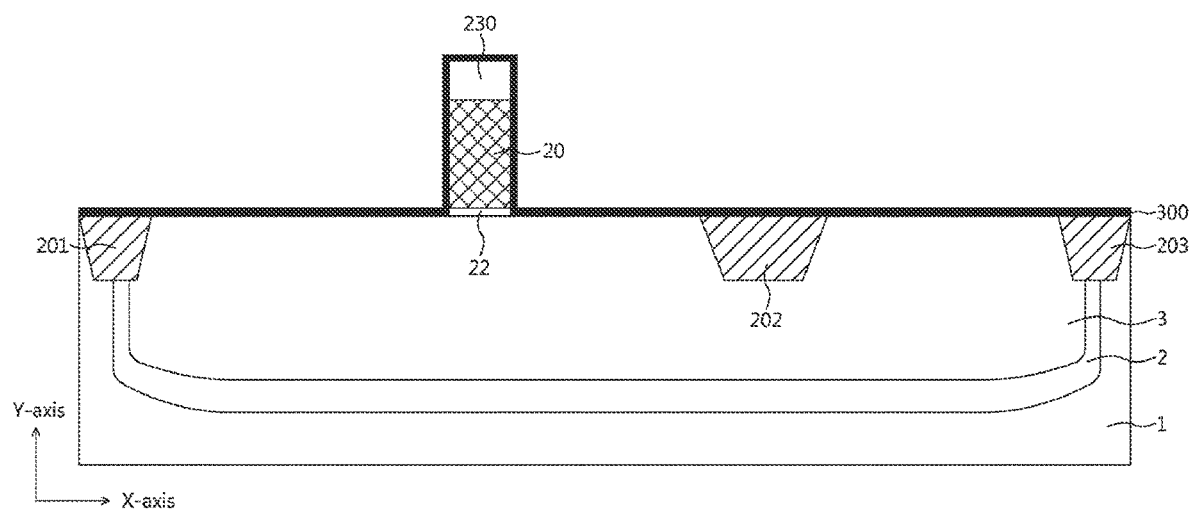

After that, like FIG. 13, a dielectric layer 300 may be formed on a substrate 1 surface, a side of a floating gate 20, and a surface of a hard mask 230. A dielectric layer 300 may be a silicon oxide layer, a silicon nitride layer, or a multilayer such as a combination of them, Oxide layer-Nitride layer-Oxide layer (ONO insulating film).

Figure 14:
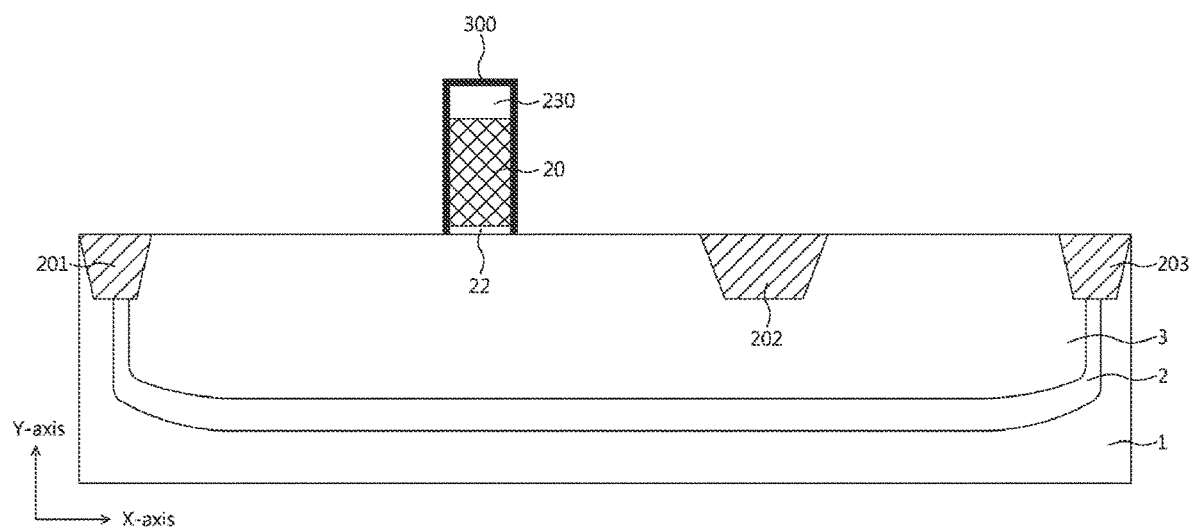

After that, like FIG. 14, a dielectric layer formed on a substrate 1 may be removed. Thus, a dielectric layer 300 may be formed only on a surface of a floating gate 20 and a hard mask 230.

Next, forming a selection gate, a control gate, and a logic gate may be performed.

Figure 15:
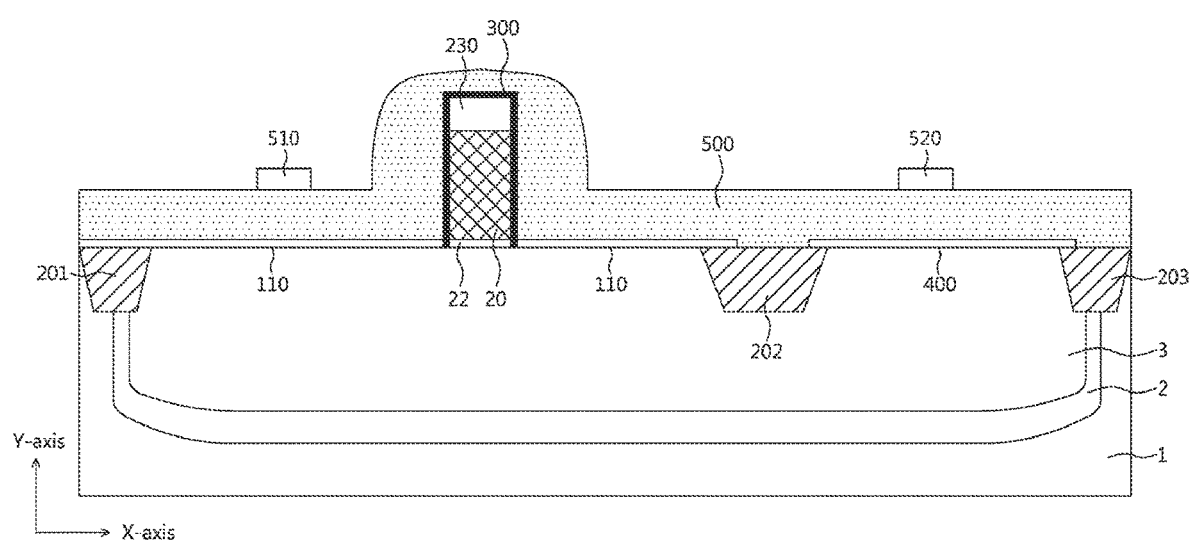

With reference to FIG. 15, a high voltage gate insulating film 110 (HV Gox) is deposited on a substrate where a selection gate may be formed, and a logic gate insulating film 400 is respectively formed on a substrate where a logic gate may be formed. Then, a second poly-silicon 500, which is a type of a conductive layer, is formed to cover a top and a side wall of a floating gate 20, and a substrate. A second poly-silicon 500 may be formed with a thickness to form a selection gate, a control gate, and a logic gate. After that, a mask pattern 510, 520 may be formed for patterning a selection gate and a logic gate. A mask pattern 510, 520 may be formed by using an oxide layer, a nitride layer, or an insulating film stacking oxide layer/nitride layer.

Figure 16:
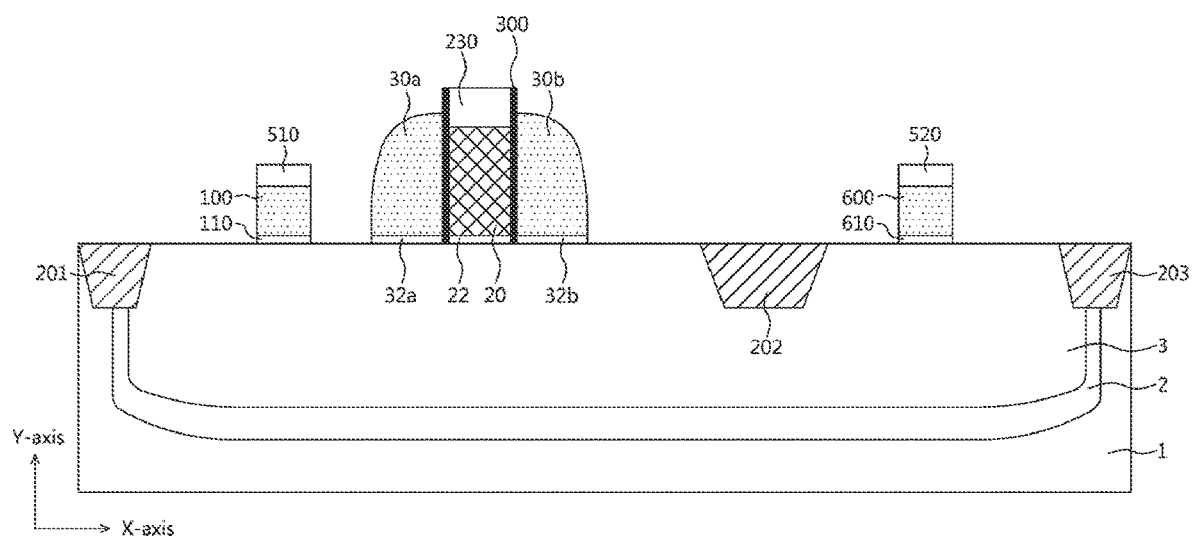

With reference to FIG. 16, a selection gate 100 and a logic gate 600 are formed by using a mask pattern 510, 520. A first and a second control gate 30*a*, 30*b* are formed by etch-back process.

After the above processes are performed, a selection gate 100, a first and a second control gate 30*a*, 30*b*, and a floating gate 20 may be formed between a first trench 201 and a second trench 202. A logic gate 600 may be formed between a second trench 202 and a third trench 203. A selection gate 100 may play a role to block a leakage current in a substrate 1.

Figure 17:
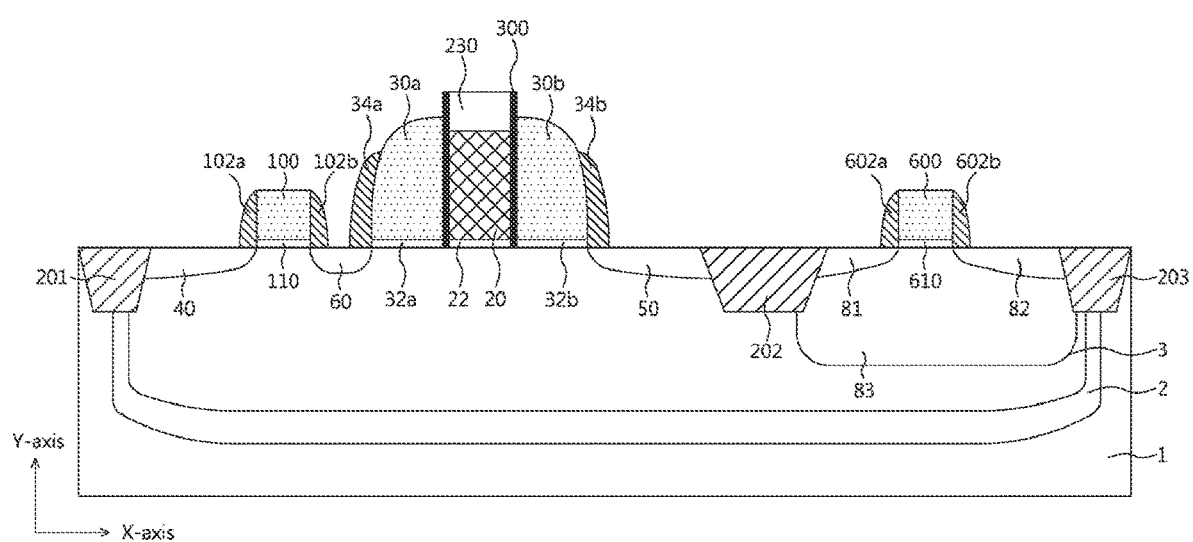

As illustrated in FIG. 17, low concentration doping regions 40, 50, 60, 81, 82 may be formed in a substrate 1. A well region 83 may be additionally formed under a logic gate 600. A low concentration doping region 81, 82 may be formed inside a well region 83. Spacers 102*a*, 102*b*, 34*a*, 34*b*, 602*a*, 602*b* may be formed on a side of a selection gate 100, a first and a second control gate 30*a*, 30*b*, and a logic gate 600, respectively. When a spacer is formed, mask patterns 510, 520 used in FIG. 16 may be removed.

Figure 18:
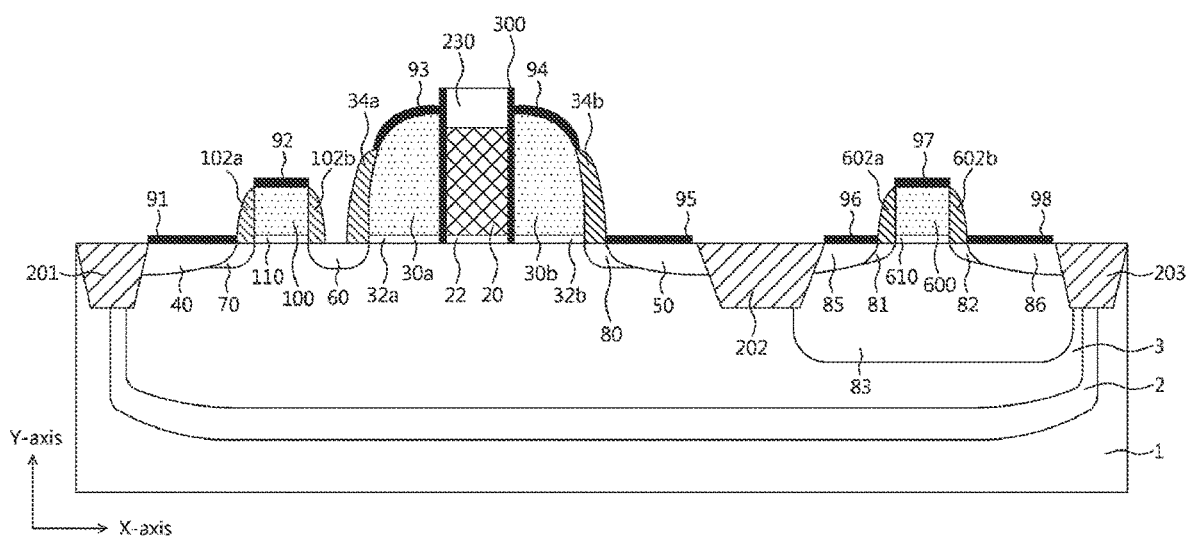

And, as illustrated in FIG. 18, high concentration source/drain regions 70, 80, 85, 86 may be formed, and silicides 91, 92, 93, 94, 95, 96, 97, 98 may be formed.

Figure 19:
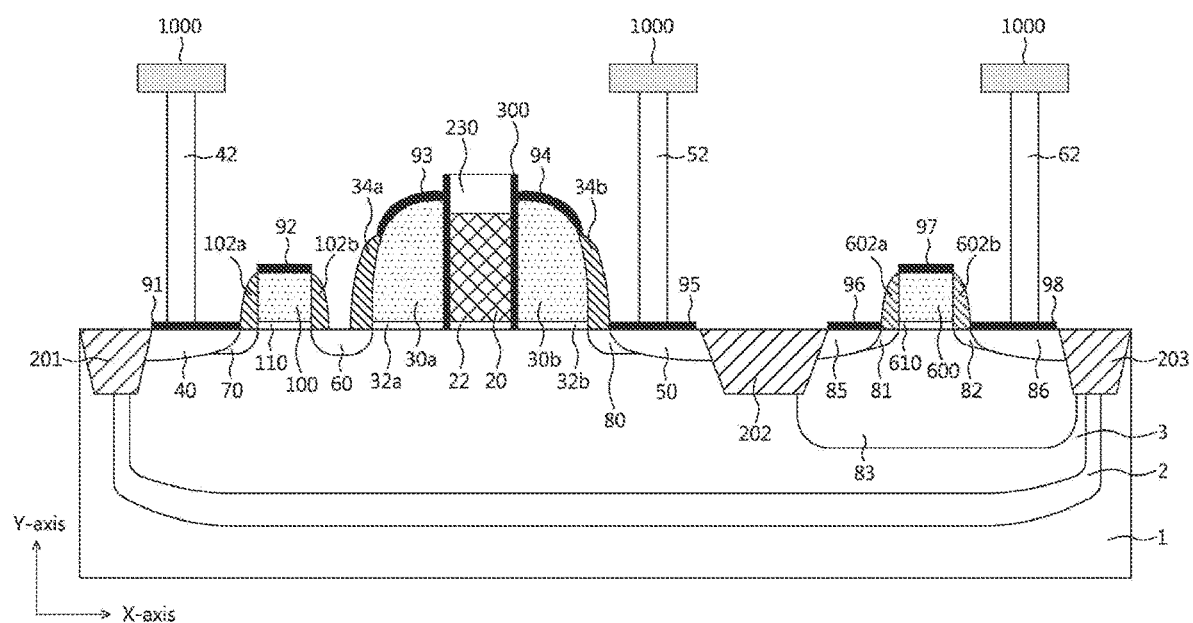

Similar to FIG. 19, contact plugs 42, 52, 62 may be formed to each connect with a metal wiring 1000.

According to the manufacturing process, a selection gate 100 may be formed in an active area of a memory device, and a selection gate 100 may prevent an occurrence of a leakage current when a memory device is in an off state.

According to the disclosure, by forming a selection gate in an active area on a substrate, an occurrence of a leakage current may be efficiently prevented when a control gate is in an off state.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A non-volatile memory device, comprising:
a source region and a drain region disposed in a channel length direction on a substrate;
a flash cell, comprising a floating gate and a control gate, disposed between the source region and the drain region;
a selection gate disposed between the source region and the flash cell;
a selection line connecting the selection gate;
a word line connecting the control gate;
a common source line connected to the source region;
a bit line connected to the drain region;
a control gate pick up structure, connected to the control gate, comprising a plurality of floating gate poly-silicon patterns; and
a control gate contact plug disposed between the plurality of floating gate poly-silicon patterns.

2. The non-volatile memory device of claim 1,
wherein a length of the selection gate is longer than a length of the floating gate, based on a direction orthogonal to the channel length direction, and
wherein the length of the floating gate is shorter than a length of the control gate, based on the direction orthogonal to the channel length direction.

3. The non-volatile memory device of claim 1, further comprising:
an extended selection gate connected to the selection gate; and
a selection gate contact plug disposed in the extended selection gate.

4. The non-volatile memory device of claim 3,
wherein a horizontal width of the extended selection gate is wider than a horizontal width of the selection gate.

5. The non-volatile memory device of claim 1,
wherein a spacer of the control gate and a spacer of the selection gate are spaced apart or in contact with each other.

6. The non-volatile memory device of claim 1,
wherein the selection gate is disposed lower than the floating gate or the control gate, relative to a surface of the substrate.

7. The non-volatile memory device of claim 1,
wherein the selection line and the word line are in parallel with each other,
wherein the common source line and the bit line are in parallel with each other, and wherein the selection line and the word line are orthogonal to the common source line and the bit line, respectively.

8. The non-volatile memory device of claim 1, further comprising:
a low concentration doping region disposed between the flash cell and the selection gate.

9. The non-volatile memory device of claim 1, wherein floating gates are disposed in the control gate from a top view of the non-volatile memory device.

10. A non-volatile memory device, comprising:
a source region and a drain region disposed in a channel length direction on a substrate;
a flash cell, comprising a floating gate and a control gate, disposed between the source region and the drain region;
a selection gate disposed between the source region and the flash cell;
an extended selection gate extending from the selection gate; and
a control gate pick up structure, connected to the control gate, comprising floating gate poly-silicon patterns; and
a control gate contact plug disposed between the floating gate poly-silicon patterns.

11. The non-volatile memory device of claim 10, wherein the control gate includes a first control gate and a second control gate,
wherein the first control gate and the second control gate are connected to each other and disposed to surround the floating gate, and
wherein widths of the first control gate and the second control gate are identical to each other.

12. The non-volatile memory device of claim 10, further comprising:
a floating gate insulating film disposed between the substrate and the floating gate;
a control gate insulating film disposed between the substrate and the control gate; and
a selection gate insulating film disposed between the substrate and the selection gate.

13. The non-volatile memory device of claim 10, further comprising
a selection gate contact plug disposed in the extended selection gate.

14. The non-volatile memory device of claim 10, further comprising:

a control gate spacer disposed on a side of the control gate; and
a selection gate spacer disposed on a side of the selection gate.

15. The non-volatile memory device of claim 14, wherein the control gate spacer and the selection gate spacer are spaced apart from each other.

16. The non-volatile memory device of claim 14, wherein the control gate spacer and the selection gate spacer are in contact with each other.

17. The non-volatile memory device of claim 10, wherein the selection gate is disposed lower than the floating gate or the control gate, relative to a surface of the substrate.

18. The non-volatile memory device of claim 10, wherein a length of the selection gate is longer than a length of the floating gate, based on a direction orthogonal to the channel length direction, and
wherein the length of the floating gate is shorter than a length of the control gate, based on the direction orthogonal to the channel length direction.

19. A non-volatile memory device, comprising:
trenches disposed in a substrate;
a first source region and a first drain region disposed between a first trench of the trenches and a second trench of the trenches;
a second source region and a second drain region disposed between the second trench and a third trench of the trenches;
a flash cell comprising a floating gate, and a first control gate and a second control gate disposed on opposing sides of the floating gate, respectively, wherein the flash cell is disposed between the first source region and the first drain region;
a selection gate disposed between the source region and the flash cell; and
a logic gate disposed between the second source region and the second drain region,
wherein a length of the selection gate is longer than a length of the floating gate, and
wherein the length of the floating gate is shorter than a length of the control gate.

20. The non-volatile memory device of claim 19, further comprising a well region, disposed below the logic gate, between the second trench and the third trench.

* * * * *